(12) United States Patent
Liu et al.

(10) Patent No.: US 8,016,458 B2
(45) Date of Patent: Sep. 13, 2011

(54) LED ILLUMINATION DEVICE

(75) Inventors: Tay-Jian Liu, Taipei Hsien (TW); Ying Xiong, Shenzhen (CN); Feng Tian, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 312 days.

(21) Appl. No.: 12/494,311

(22) Filed: Jun. 30, 2009

(65) Prior Publication Data

US 2010/0259934 A1    Oct. 14, 2010

(30) Foreign Application Priority Data

Apr. 13, 2009  (CN) .......................... 2009 1 0301519

(51) Int. Cl.
*F21V 29/00* (2006.01)
(52) U.S. Cl. ....................... 362/294; 362/373
(58) Field of Classification Search .................. 362/294, 362/373
See application file for complete search history.

(56) References Cited

U.S. PATENT DOCUMENTS

| 7,841,753 B2 * | 11/2010 | Liu .............................. 362/373 |
| 2006/0193139 A1 * | 8/2006 | Sun et al. ...................... 362/373 |
| 2010/0060132 A1 * | 3/2010 | Liu et al. ......................... 313/46 |

* cited by examiner

*Primary Examiner* — Stephen F Husar
*Assistant Examiner* — James Cranson, Jr.
(74) *Attorney, Agent, or Firm* — Altis Law Group, Inc.

(57) ABSTRACT

An LED illumination device includes a hollow lamp housing, an optical part having a light source, a circuit board and a heat dissipation part received in the hollow lamp. The optical part and the circuit board are located at front and rear ends of the lamp housing, respectively. The heat dissipation part is located between the optical part and the circuit board, and includes a cylindrical air guider, a heat sink and a cooling fan received in the air guider. The heat sink includes a base and a plurality of fins. The light source is arranged on a heat absorbing surface of the base. The air guider includes an annular ring and a plurality of spaced vanes extending axially from the annular ring. The lamp housing defines a plurality of first and second air holes through a circumferential surface thereof corresponding to the air guider.

15 Claims, 9 Drawing Sheets

US 8,016,458 B2

LED ILLUMINATION DEVICE

BACKGROUND

1. Technical Field

The present disclosure generally relates to light emitting diode (LED) illumination devices, and particularly to an LED illumination device with a high heat dissipating efficiency.

2. Description of Related Art

In recent years, LEDs are preferred for use in illumination devices rather than CCFLs (cold cathode fluorescent lamps) due to their excellent properties, including high brightness, long lifespan, wide color range, and etc.

For an LED, eighty percents to ninety percents of the power consumed by the LED is converted into thermal energy, and only ten percents to twenty percents of the power consumed by the LED is converted into light. In addition, a plurality of LEDs are generally packaged in a single LED illumination device in order to obtain a desirable illumination brightness. Therefore, heat dissipation of the LED illumination device is a problem inhibiting the application of the LED illumination device, which requires to be resolved.

For a high brightness LED illumination device, a highly efficient heat dissipation device is necessary in order to timely and adequately remove the heat generated by the LED illumination device. Otherwise, the brightness, lifespan, and reliability of the LED illumination device will be seriously affected. Conventional heat dissipation devices, such as heat sinks, can no longer satisfy the heat dissipation requirement of the high brightness LED illumination device.

In order to enhance heat dissipation efficiency, air moving devices such as cooling fans are employed in combination with heat sinks to dissipate the heat of the high brightness LED illumination device. The cooling fan generates an airflow which flows through the metal fins of the heat sink, to thereby dissipate the heat of the high brightness LED illumination device. This kind of thermal design is suitable for a majority of LED illumination devices, but is not suitable for some LED illumination devices which have a critical heat dissipation requirement. It is believed that the heat dissipation efficiency of the conventional heat dissipation devices can be further improved.

For the foregoing reasons, therefore, there is a need in the art for an LED illumination device which overcomes the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
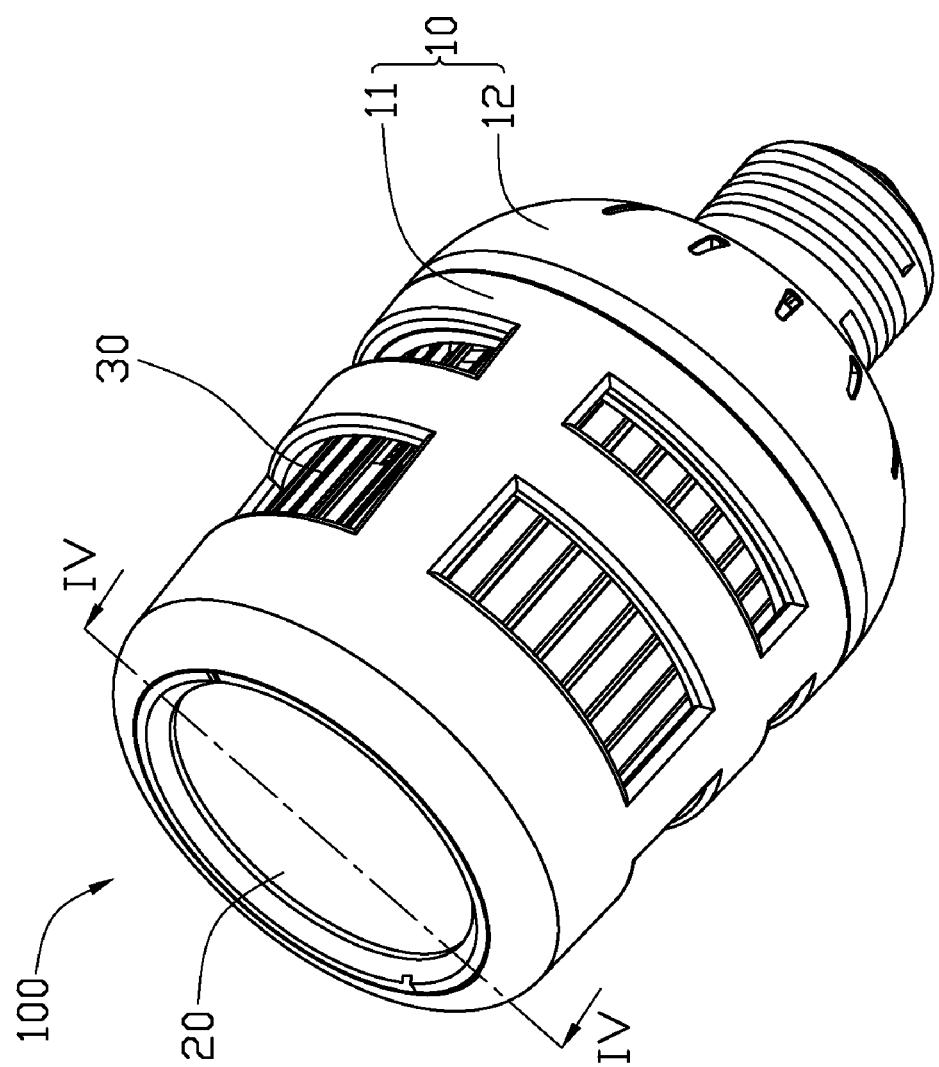
FIG. 1 is an assembled, isometric view of an LED illumination device according to an exemplary embodiment.
Figure 2:
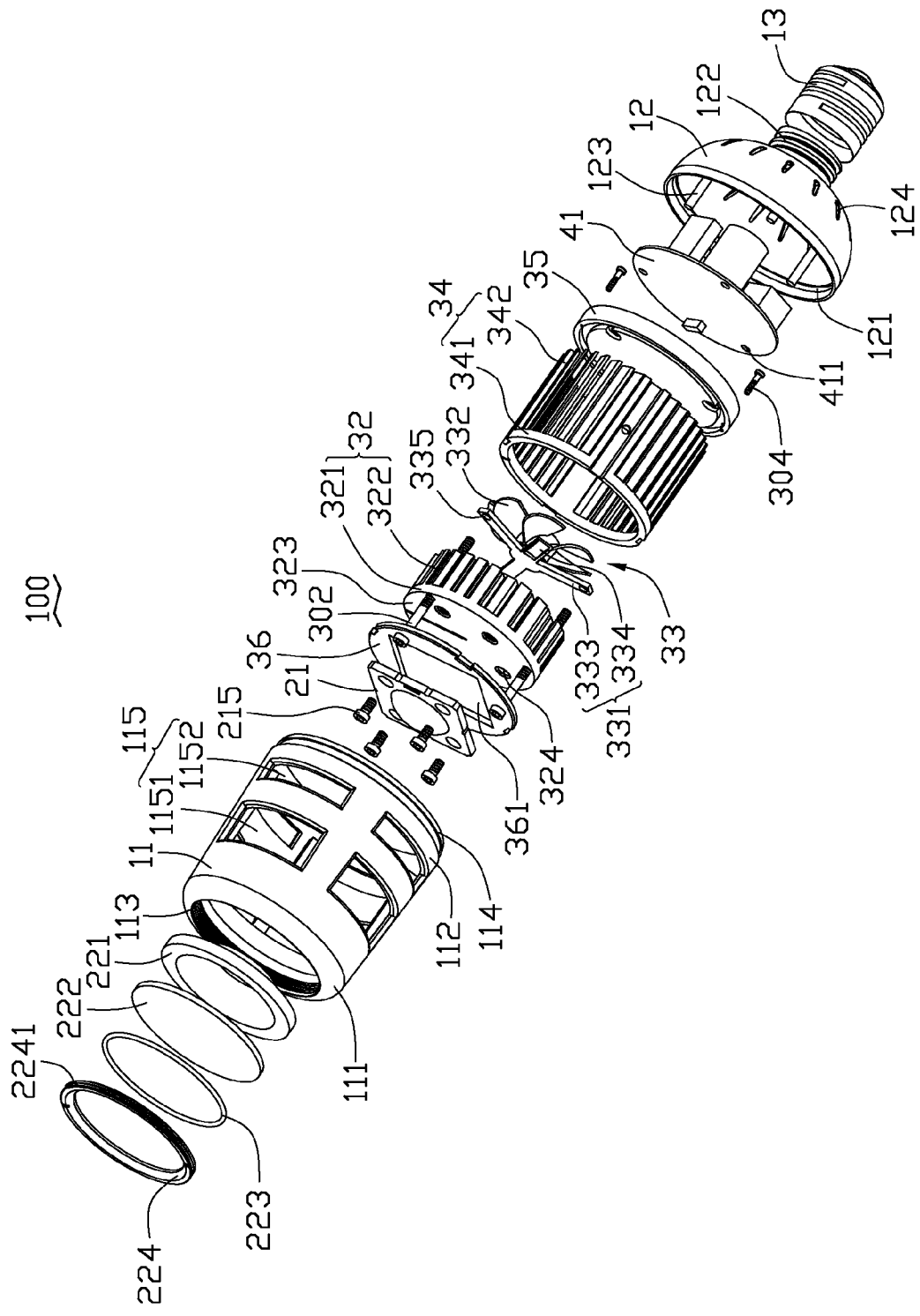
FIG. 2 is an exploded, isometric view of the LED illumination device of FIG. 1.

Referring to FIGS. 1-2, an LED illumination device 100 according to an exemplary embodiment includes a hollow lamp housing 10, an optical part 20, a heat dissipation part 30, and an electrical part provided with a circuit board 41. The LED illumination device 100 is substantially cylindrical. The optical part 20, the heat dissipating part 30 and the circuit board 41 of the electrical part are arranged in the lamp housing 10. The optical part 20 is located at a front end of the LED illumination device 100, while the circuit board 41 of the electrical part is located at a rear end of the LED illumination device 100. The heat dissipation part 30 is located between the optical part 20 and the circuit board 41 of the electrical part.

The lamp housing 10 includes a front shell 11 and a rear shell 12 connected to the front shell 11. The optical part 20 and the heat dissipation part 30 are arranged in the front shell 11, while the circuit board 41 of the electrical part is arranged in the rear shell 12.

Figure 3:
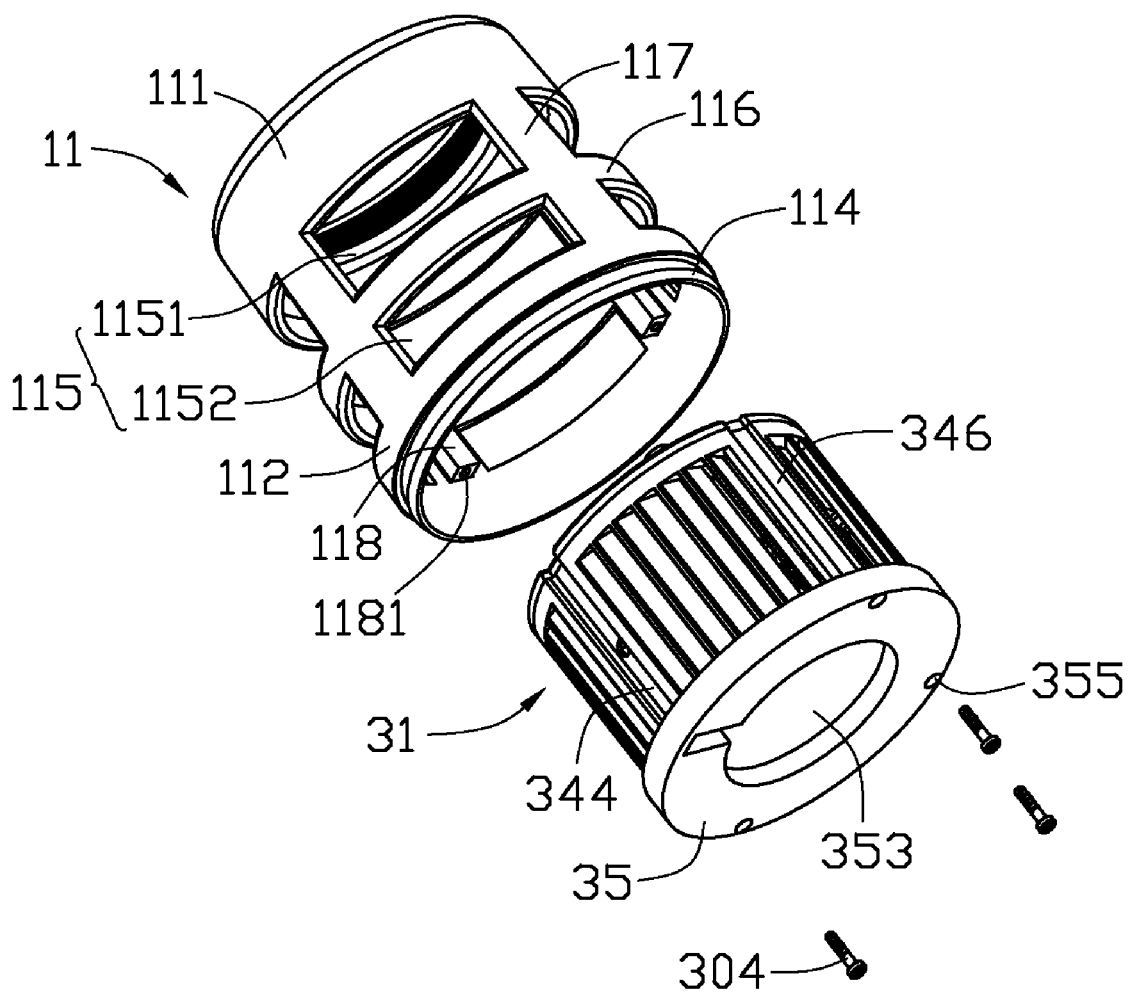
FIG. 3 shows a front shell and a light engine of the LED illumination device of FIG. 2.
Figure 4:
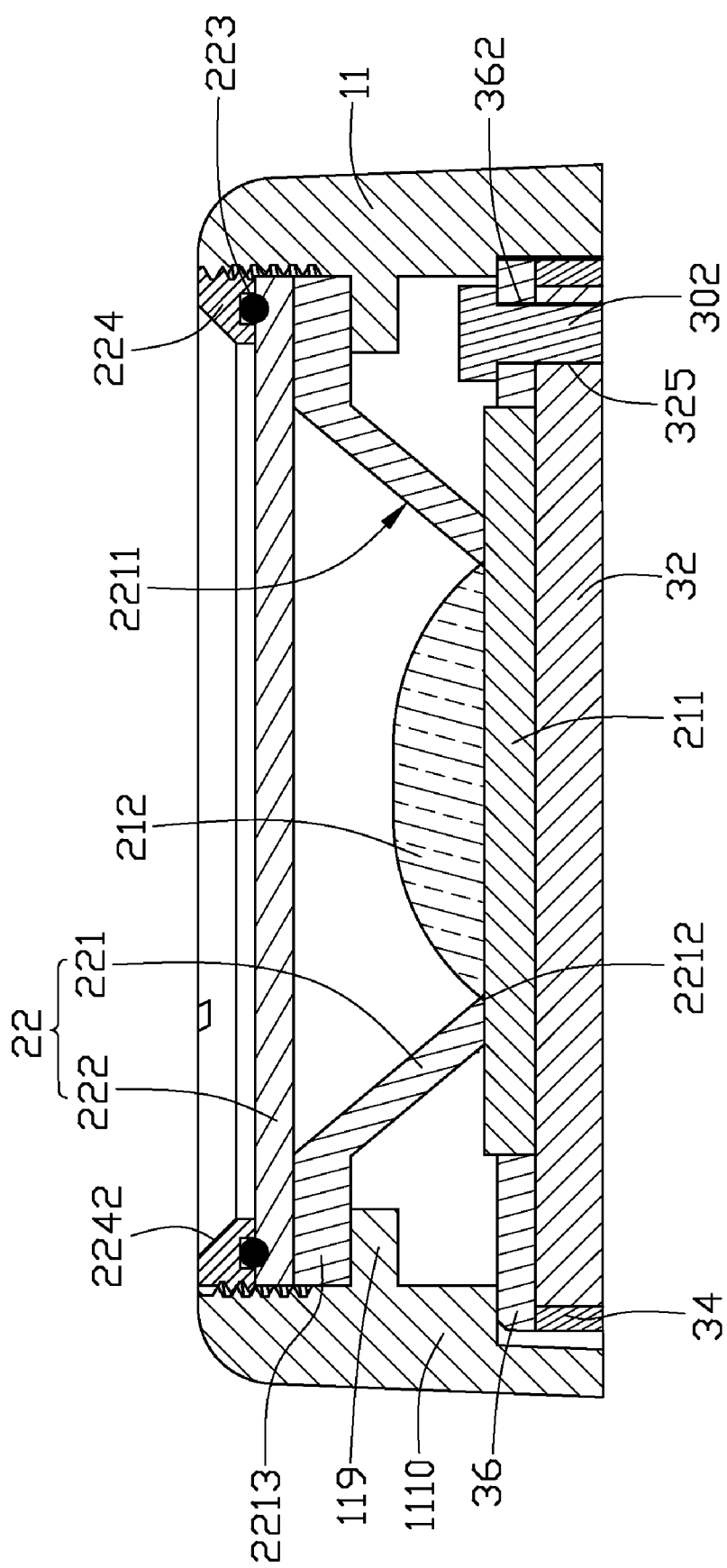
FIG. 4 is a cross-section view of a front portion of the LED illumination device of FIG. 1, taken along line IV-IV thereof.

Referring also to FIGS. 3-4, the front shell 11 is a hollow cylinder, and has a front end 111 and an opposite rear end 112 connecting with the rear shell 12. An outer diameter of the front shell 11 is gradually increased from the front end 111 to the rear end 112. The front end 111 of the front shell 11 has an inner screw thread 113 formed on an inner surface thereof. A projecting ring 119 is formed on the inner surface of the front end 111 of the front shell 11 and located below the inner screw thread 113. A step 1110 is formed on the inner surface of the front end 111 of the front shell 11 and located below the projecting ring 119. The front shell 11 defines an air window 115 therein for allowing airflow flowing into and out of the front shell 11. The air window 115 includes a plurality of first air holes 1151 located adjacent to the front end 111 of the front shell 11 and a plurality of second air holes 1152 located adjacent to the rear end 112 of the front shell 11. The first and the second air holes 1151, 1152 are longitudinally extended in a circumferential surface of the front shell 11 and defined radially through the circumferential surface of the front shell 11. The front shell 11 has a middle annular partition ring 116 formed between the first and the second air holes 1151, 1152 to separate the first and the second air holes 1151, 1152 from each other. The front shell 11 further has a plurality of partition ribs 117 extending axially along an axial direction thereof. Each partition rib 117 separates two adjacent first air holes from each other 1151 and two adjacent second air holes 1152 from each other.

The rear shell 12 is cup-shaped. The rear shell 12 has an open front end connected with the rear end 112 of the front shell 11, and a rear screw base 122 electrically connected with a cap 13 which is used to be threadedly engaged in a power socket (not shown) whereby the LED illumination device 100 can obtain power from an external power source. An inner space of the rear shell 12 is used for accommodating the circuit board 41 of the electrical part. A plurality of air passage apertures 124 are defined radially through the rear shell 12 at a position adjacent to the screw base 122. The air passage apertures 124 communicate the inner space of the rear shell 12 with an environment and are utilized for dissipating heat generated by the circuit board 41.

The heat dissipation part 30 is provided with a heat sink 32, a cooling fan 33 and an air guider 34. The heat sink 32, the cooling fan 33 and the air guider 34 are arranged in the front shell 11.

The heat sink 32 includes a column-shaped solid base 321 and a plurality of fins 322 formed on the solid base 321. The solid base 321 has a heat absorbing surface 323 at a front side thereof facing the optical part 20, and an opposite rear end surface at a rear side thereof. The fins 322 extend axially from the rear end surface of the solid base 321 towards the circuit board 41 of the electrical part. When the heat sink 32 is arranged in the front shell 11, the first air holes 1151 surround a portion of the solid base 321 and a large portion of the fins 322. The solid base 321 defines axially a plurality of through holes 325 (referring to FIG. 4) therein. The through holes 325 extend through the heat absorbing surface 323 and the rear end surface of the solid base 321, and are located adjacent to a circumferential edge of the solid base 321.

The cooling fan 33 is provided between the heat sink 32 and the circuit board 41 of the electrical part. The cooling fan 33 includes a bracket 331 having three ribs 333 and a wire guiding pole 334, a stator (not shown) mounted on the bracket 331 and an impeller 332 rotatably mounted to the stator. The wire guiding pole 334 is located between two of the ribs 333 of the bracket 331. The wire guiding pole 334 is used for supporting and guiding electrical wires of the cooling fan 33, thereby preventing the electrical wires of the cooling fan 33 from disturbing the rotation of the cooling fan 33. A plurality of fixing holes 335 are defined in free ends of the ribs 333 of the bracket 331 corresponding to the through holes 325 of the heat sink 32.

The air guider 34 is cylindrical, and includes an annular ring 341 and a plurality of vanes 342 extending axially from the annular ring 341 towards the circuit board 41 of the electrical part. The vanes 342 are spaced from each other and each vane 342 has a cross-section of a parallelogram. An air passage 343 is defined between every two adjacent vanes 342. The heat sink 32 and the cooling fan 33 are received in the air guider 34.

Figure 5:
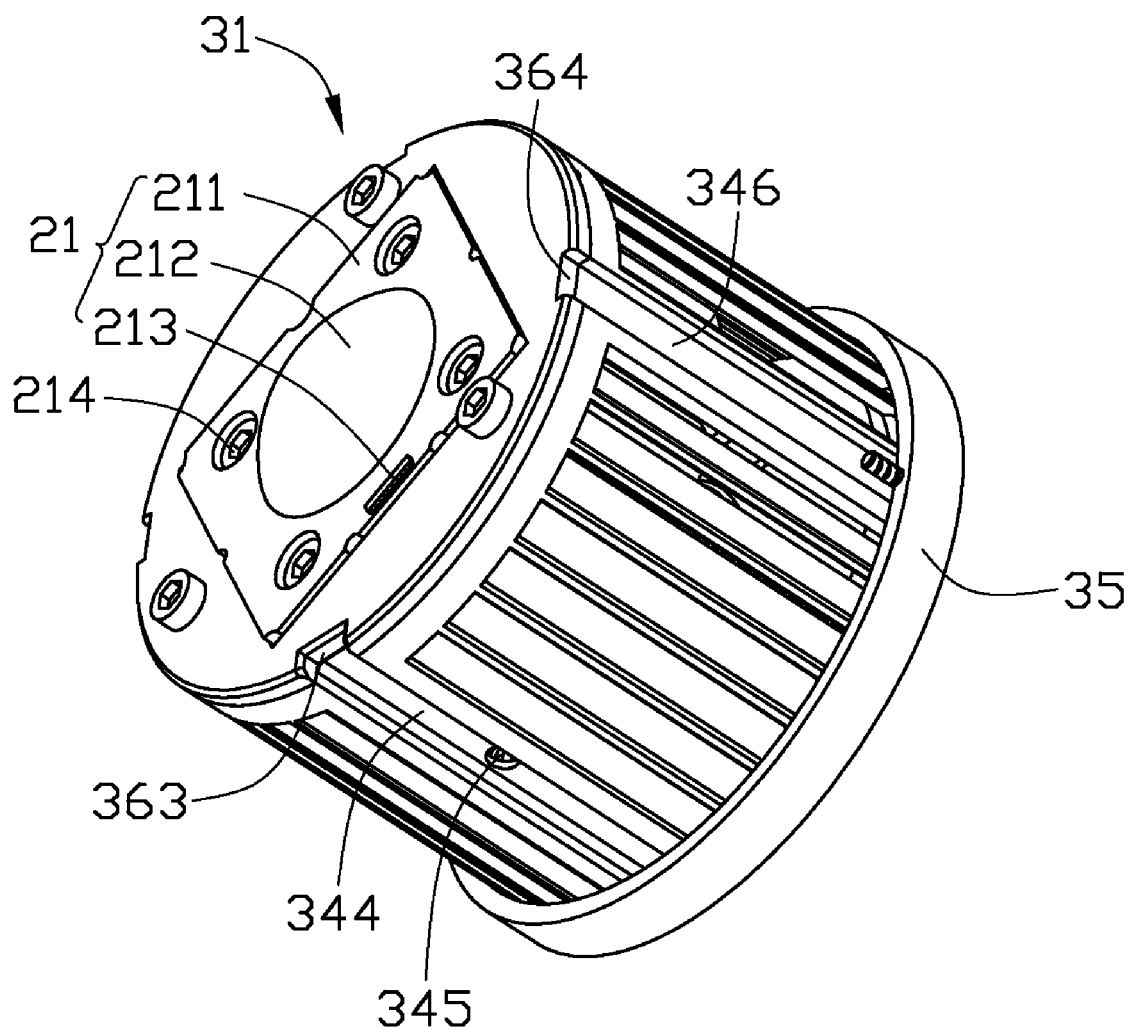
FIG. 5 shows the light engine of FIG. 3 viewed from another viewpoint.
Figure 6:
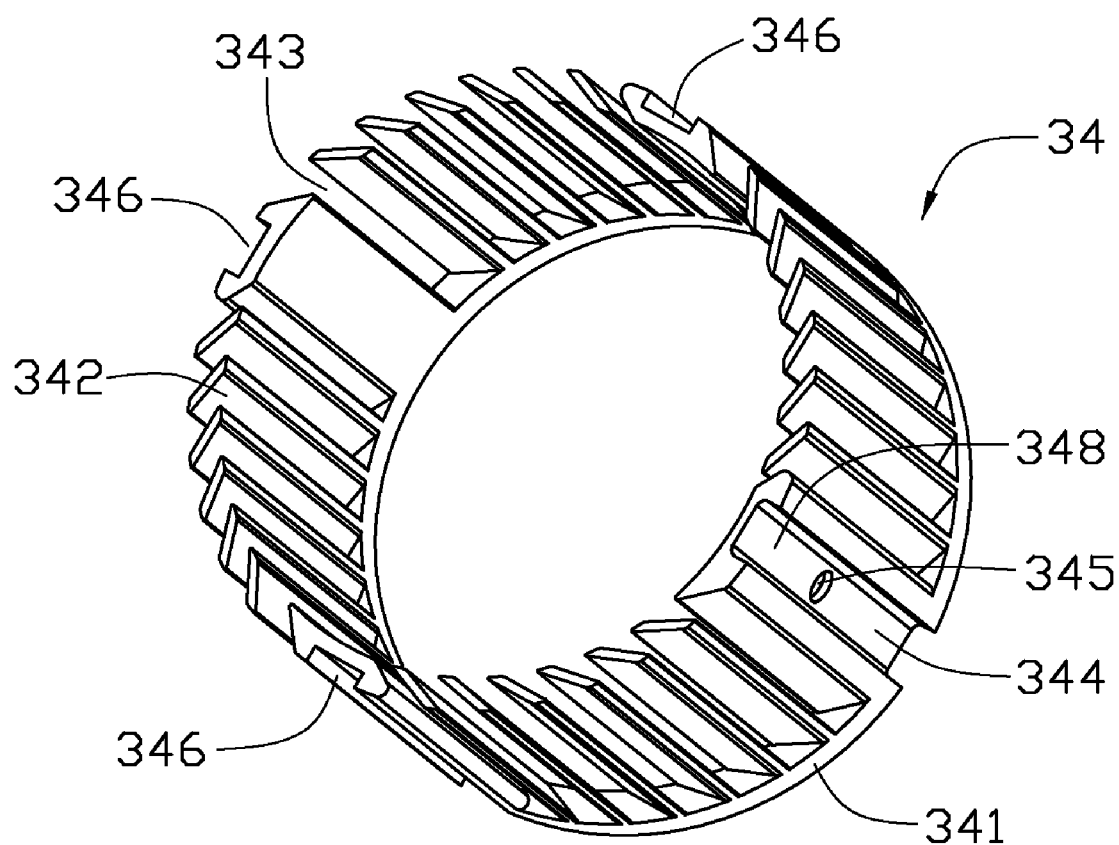
FIG. 6 shows an air guider of the LED illumination device of FIG. 2.

The optical part 20 is arranged in the front end 111 of the front shell 11. The optical part 20 includes a light source 21 mounted on the heat absorbing surface 323 of the solid base 321 of the heat sink 32, and a light emitting passage 22 (referring to FIG. 4). Referring also to FIG. 5, the light source 21, the heat sink 32, the cooling fan 33 and the air guider 34 cooperatively form a light engine 31 for the LED illumination device 100. The light source 21 is thermally attached to the heat absorbing surface 323 of the solid base 321, whereby heat generated by the light source 21 is transferred to and effectively dissipated by the heat sink 32.

The light source 21 includes a substrate 211 forming electrical circuits thereon, a plurality of electrodes 213 formed on substrate 211, and at least one LED 212 (light emitting diode) arranged on and electrically connected to the electrical circuits of the substrate 211. A plurality of through holes 214 are defined in the substrate 211 and located adjacent to a peripheral edge of the substrate 211. The solid base 321 of the heat sink 32 defines a plurality of fixing holes 324 (referring to FIG. 2) in the heat absorbing surface 323 corresponding to the through holes 214 of the substrate 211. A plurality of screws 215 are used to extend through the through holes 214 of the substrate 211 and threadedly engage into the fixing holes 324 of the solid base 321 to thereby securely attach the substrate 211 of the light source 21 to the heat absorbing surface 323 of the solid base 321. The electrodes 213 formed on the substrate 211 are used for electrically connecting the LED 212 of the light source 21 with the circuit board 41 of the electrical part via a plurality of electrical wires. Alternatively, electrical circuits formed on the substrate 211 can be directly formed on the heat absorbing surface 323 of the solid base 321, and the LED 212 is directly attached to the electrical circuits on the heat absorbing surface 323 of the solid base 321, whereby the substrate 211 can be omitted and a heat resistance between the LED 212 and the solid base 321 is reduced.

The light emitting passage 22 includes a light reflector 221 and an optical lens 222 which are received in the front shell 11. The light reflector 221 has a configuration of a hollow, truncated cone, tapering from the front end 111 towards the rear end 112 of the front shell 11. The light reflector 221 has a rear end located adjacent to the heat sink 32, and a front end located away from the heat sink 32. A through hole 2212 is defined in the rear end of the light reflector 221 for extension of the LED 212 of the light source 21 therein. A mounting ring 2213 is formed at the front end of the light reflector 221. When the light reflector 221 is arranged in the front shell 11, the rear end of the light reflector 221 abuts the substrate 211 of the light source 21 and the LED 212 of the light source 21 is received in the through hole 2212 of the light reflector 221. The mounting ring 2213 of the light reflector 221 is supported by the projecting ring 119 of the front shell 11.

The optical lens 222 is located at the front end of the light reflector 221. A peripheral edge of the optical lens 222 is attached to the mounting ring 2213 of the light reflector 221. The light reflector 221 and the optical lens 222 provide luminescence characteristics for the light source 21 and protect the light source 21. Light emitted by the light source 21 is reflected and guided by the light reflector 221 to an outside of the front shell 11 through the optical lens 222. An annular fixing member 224 is provided in front of the optical lens 222. The fixing member 224 forms an outer screw thread 2241 on an outer circumferential surface thereof corresponding to the inner screw thread 113 of the front shell 11. The fixing member 224 threadedly engages with the front end 111 of the front shell 11 to thereby securely attach the optical lens 222 and the light reflector 221 in the front end 111 of the front shell 11. An inner surface 2242 of the fixing member 224 expands along a direction from the rear end 112 towards the front end 111 of the front shell 11, to thereby prevent the fixing member 224 from blocking the light emitted by light source 21. Further, a gasket 223 is provided between the optical lens 222 and the fixing member 224 for effectively blocking dust or liquid from entering the front part of the LED illumination device 100 to contaminate or wet the LED 212.

In order to mount the components of the light engine 31 together conveniently, a positioning plate 36 and a bottom plate 35 are provided at front and rear ends of the light engine 31, respectively. The positioning plate 36 is circular and defines a rectangular positioning hole 361 in a central portion thereof. The positioning hole 361 of the positioning plate 36 is used for receiving the substrate 211 of the light source 21 therein, to thereby make the light source 21 be positioned and mounted to the heat absorbing surface 323 of the solid base 321 conveniently and quickly. The positioning plate 36 further defines a plurality of the through holes 362 (referring to FIG. 4) corresponding to the through holes 325 of the solid base 321. The through holes 362 of the positioning plate 36 are located adjacent to a circumferential edge of the positioning plate 36.

Figure 7:
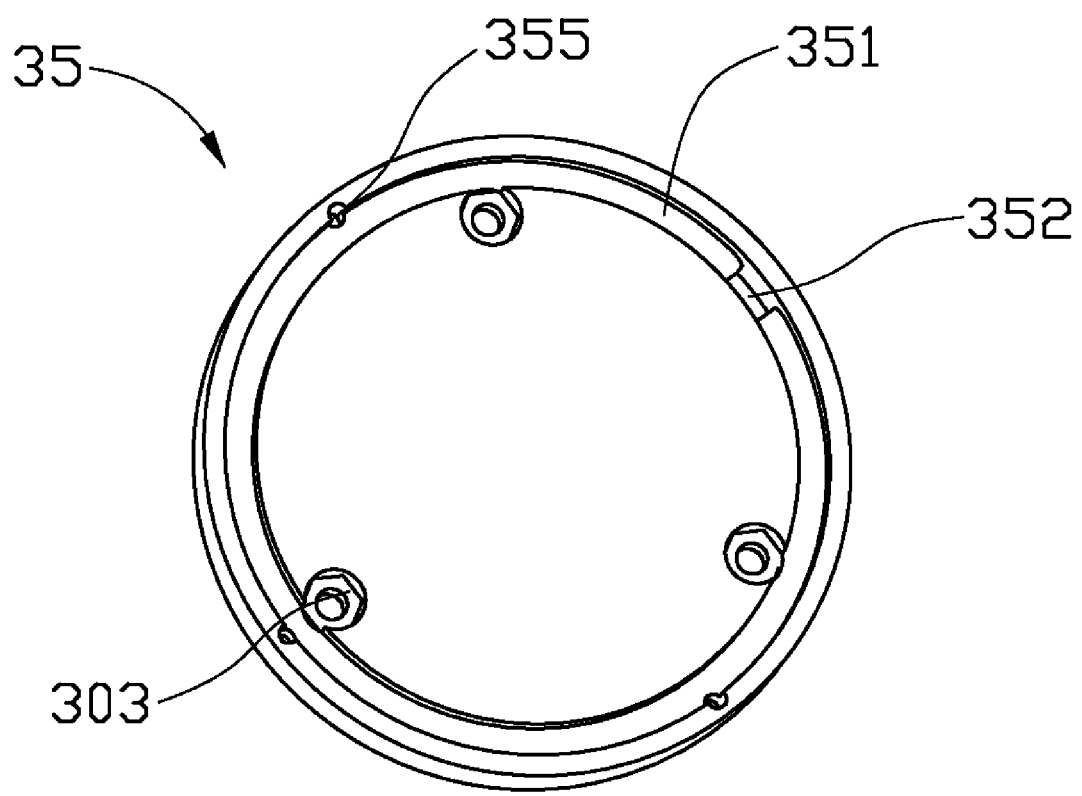
FIG. 7 shows a bottom plate of the light engine of the LED illumination device of FIG. 3.
Figure 8:
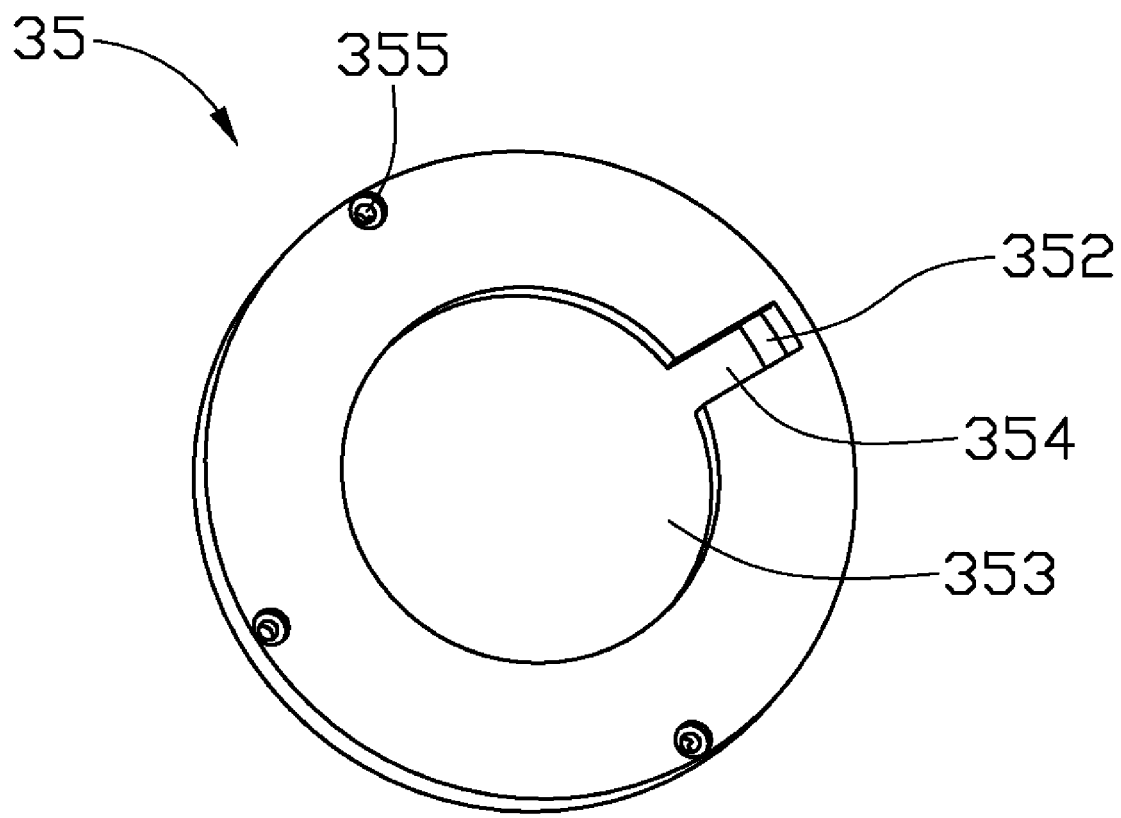
FIG. 8 shows the bottom plate of FIG. 7 viewed from another viewpoint.

Referring also to FIGS. 7-8, the bottom plate 35 is circular, and has an inner surface facing the cooling fan 33 and an opposite outer surface facing the circuit board 41. A plurality of screw caps 303 are embedded in the inner surface of the bottom plate 35 and located corresponding to the through holes 325 of the solid base 321. The bottom plate 35 defines an annular receiving groove 351 in the inner surface thereof for receiving a rear end of the air guider 34 (i.e., free ends of the vanes 342 of the air guider 34). Further, a plurality of elongated bolts 302 are provided corresponding to the screw caps 303.

In assembly of the light engine 31, the elongated bolts 302 successively extend through the through holes 362 of the positioning plate 36, the through holes 325 of the heat sink 32, the through holes 335 of the cooling fan 33, and then threadedly engage into the screw caps 303 of the bottom plate 35, thereby fastening the positioning plate 36, the heat sink 32, the cooling fan 33 and the bottom plate 35 together. The substrate 211 of the light source 21 is received in the positioning hole 361 of the positioning plate 36 and fixed to the heat absorbing surface 323 of the solid base 321 via the screws 215.

In order to mount the light engine 31 in the front shell 11 conveniently and firmly, the front shell 11 forms a plurality of protruding bars 118 on the inner surface thereof, the air guider 34 defines axially a plurality of elongate grooves 346 in an outer circumferential surface thereof corresponding to the protruding bars 118 of the front shell 11, and the positioning plate 36 defines a plurality of cutouts 364 (best seen in FIG. 5) in the circumferential edge thereof corresponding to the elongate grooves 346 of the air guider 34. Each of the protruding bars 118 extends axially along a partition rib 117 of the front shell 11. A fixing hole 1181 is defined in a rear end of each protruding bar 118 adjacent to the rear shell 12. Each elongate groove 346 of the air guider 34 is formed by connecting inner portions of two adjacent vanes 342 of the air guider 34 together, to thereby enhance the structure strength of the air guider 34. The bottom plate 35 defines a plurality of countersunk holes 355 therein corresponding to the fixing holes 1181 of the protruding bars 118.

When the light engine 31 is inserted into the front shell 11 from the rear end 112 of the front shell 11, the cutouts 364 of the positioning plate 36 and the elongate grooves 346 of the air guider 34 are aligned with the protruding bars 118 of the front shell 11, respectively. The light engine 31 slides forwardly along the protruding bars 118 till the positioning plate 36 abutting the step 1110 of the front shell 11. Then a plurality of screws 304 extend through the countersunk holes 355 of the bottom plate 35 and threadedly engage into the fixing holes 1181 of the protruding bars 118, thereby securely fixing the light engine 31 in the front shell 11.

The circuit board 41 of the electrical part provides drive power, control circuit and power management for the light source 21. The circuit board 41 is received in the rear shell 12. The circuit board 41 electrically connects with the electrodes 213 of the light source 21 and the screw base 122 via a plurality of electrical wires, whereby the LED illumination device 100 can get the power from the external power source via the cap 13. The cooling fan 33 electrically connects with the circuit board 41 via the electrical wires of the cooling fan 33, whereby the cooling fan 33 can get power via the circuit board 41. A plurality of through holes 411 are defines in the circuit board 41 and located adjacent to a peripheral edge of the circuit board 41. The rear shell 12 forms a plurality of mounting pins 123 on an inner surface thereof corresponding to the through holes 411 of the circuit board 41 to thereby facilitate mounting of the circuit board 41 in the rear shell 12.

In order to position and guide the electrical wires which are used for electrically connected the light source 21 and the circuit board 41 and the electrical wires of the cooling fan 33, the light engine 31 is provided with a plurality of wire collection structures. The air guider 34 defines axially an elongate wire collection groove 344 in the outer circumferential surface thereof. The wire collection groove 344 is formed by connecting inner portions of two adjacent vanes 342 of the air guider 34 via a connecting plate 348, to thereby enhance the structure strength of the air guider 34. A first collection hole 345 is defined radially through the connecting plate 348 and communicates with the wire collection groove 344, to thereby allow the electrical wires of the cooling fan 33 to extend therethrough. The positioning plate 36 defines a cutout 363 (best seen in FIG. 5) in the outer circumferential edge thereof corresponding to the wire collection groove 344 of the air guider 34. The bottom plate 35 defines a second collection hole 352 therein corresponding to the wire collection groove 344 of the air guider 34. A wire storage recess 353 and a connecting recess 354 are defined in the outer surface of the bottom plate 35. The wire storage recess 353 communicates with the second collection hole 352 via the connecting recess 354.

When the light engine 31 is mounted in the front shell 11, the wire collection groove 344 of the air guider 34 is located corresponding to and covered by a partition rib 117 of the front shell 11, and the first collection hole 345 of the air guider 34 is located corresponding to the wire guiding pole 334 of the cooling fan 33. The wire collection groove 344 and the corresponding partition rib 117 cooperatively define a passage for receiving the electrical wires which are used for electrically connecting the light source 21 and the circuit board 41 and the electrical wires of the cooling fan 33. The wire collection recess 353 is used for receiving a superfluous portion of the electrical wires.

In order to connect the front and the rear shells 11, 12 together, the front shell 11 forms an annular protrusion 114 on an outer surface thereof, and the rear shell 12 defines an annular groove 121 in an inner surface thereof. The front and the rear shells 11, 12 are assembled together via an engagement between the annular protrusion 114 of the front shell 11 and the annular groove 121 of the rear shell 12. The bottom plate 35 isolates the circuit board 41 from the heat dissipation part 30.

In operation of the LED illumination device 100, heat generated by the light source 21 is transferred to the heat sink 32. Air outside the lamp housing 10 enters into the front shell 11 via the second air holes 1152, and is then guided by the vanes 342 of the air guider 34 and enters into the air guider 34 via the air passages 343 of the air guider 34. Airflow produced by the cooling fan 33 flows towards the heat sink 32, and is then guided by the vanes 342 of the air guider 34 and flows out of the air guider 34. The airflow finally flows out of the front shell 11 via the first air holes 1151. Thus, a forced air convection is circulated between the ambient atmosphere and an interior of the LED illumination device 100 to continuously dissipate the heat generated by the light source 21. The LED 212 of the light source 21 can be kept working at a lower temperature, and the brightness, lifespan, and reliability of the LED illumination device 100 will be improved. Due to the presence of the air guider 34, air flowing into and out of the lamp housing 10 can flow smoothly. Further, the air guider 34 functions as a protector to prevent people from touching the heat sink 32 and the cooling fan 33, to thereby improve the safety of the LED illumination device 100.

Alternatively, the cooling fan 33 can be configured so that the ambient air is inhaled into the front shell 11 via the first air holes 1151 and then flows through the fins 322 of the heat sink 32; finally, the airflow produced by the cooling fan 33 is exhausted out of the front shell 11 via the second air holes 1152.

Figure 9:
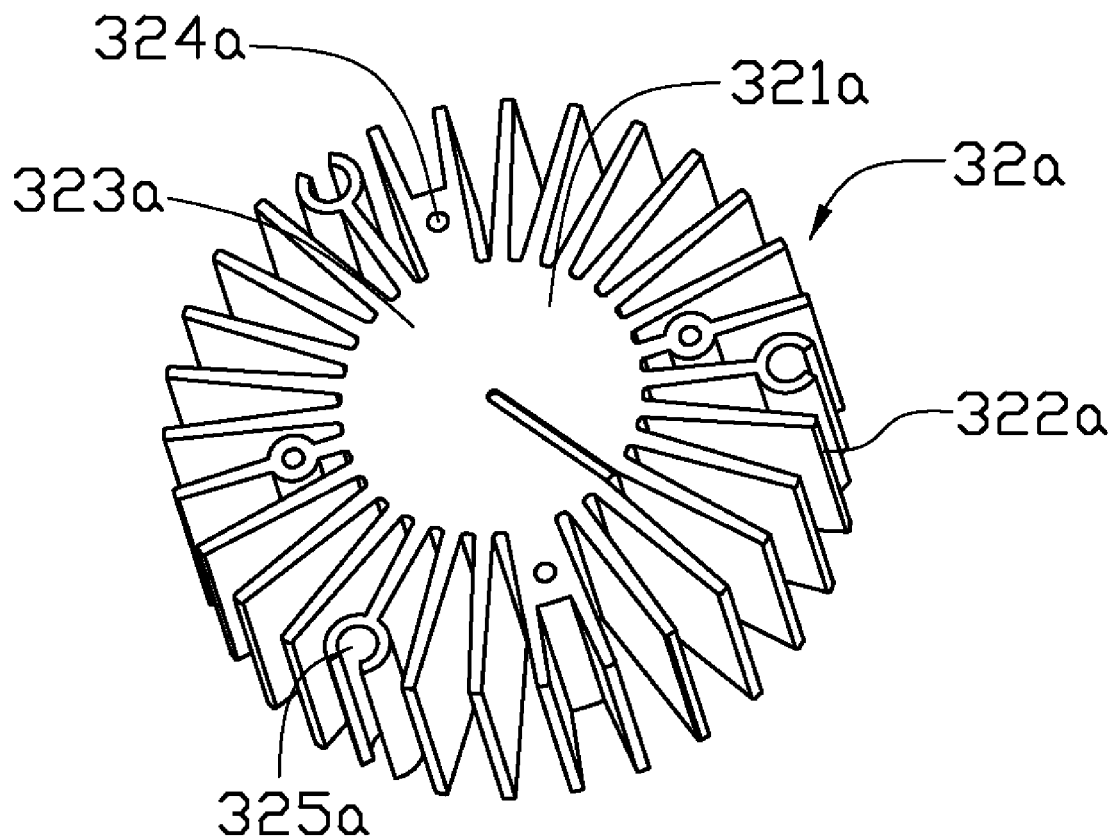
FIG. 9 is an isometric view of a heat sink of an alternative light engine.

FIG. 9 shows a heat sink 32a of an alternative light engine which includes a column-shaped solid base 321a and a plurality of fins 322a formed on the solid base 321a. The solid base 321a has a heat absorbing surface 323a to which the light source 21 is attached. The fins 322a extend radially and outwardly from a circumferential surface of the solid base 321a. The heat sink 32a has a size substantially the same as the heat sink 32 shown in FIG. 2. The heat sink 32a defines a plurality of fixing holes 324a for mounting the light source 21 to the heat absorbing surface 323a, and defines a plurality of through holes 325a for the elongated bolts 302 extending therethrough to mount the heat sink 32a in the front shell 11.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED illumination device, comprising:
a hollow lamp housing;
an optical part received in the lamp housing and located at a front end of the lamp housing, the optical part comprising a light source provided with at least one LED;
an electrical part provided with a circuit board, the circuit board being received in the lamp housing and located at a rear end of lamp housing, the circuit board electrically connecting with the light source; and
a heat dissipation part received in the lamp housing and located between the optical part and the circuit board of the electrical part, the heat dissipation part comprising:
a heat sink arranged in the lamp housing and located adjacent to the optical part, the heat sink comprising a solid base and a plurality of fins formed on the solid base; the solid base having a heat absorbing surface at a front side adjacent to the optical part, the light source being arranged on and thermally connected with the heat absorbing surface of the solid base;
a cooling fan arranged in the lamp housing and located between the heat sink and the circuit board of the electrical part; and
a cylindrical air guider arranged in the lamp housing, the air guider comprising an annular ring and a plurality of spaced vanes extending axially from the annular ring, an air passage being defined between every two adjacent vanes, the heat sink and the cooling fan being received in the air guider, the lamp housing defining a plurality of first air holes and a plurality of second air holes through a circumferential surface thereof corresponding to the air guider for allowing airflow flowing into and out of the lamp housing, an airflow produced by the cooling fan being introduced into the lamp housing via the first air holes and guided into the air guider via the vanes of the air guider, the airflow then flowing towards the heat sink and guided out of the air guider via the vanes of the air guider, and finally the airflow flowing out of the lamp housing via the second air holes.

2. The LED illumination device of claim 1, wherein the lamp housing comprises a front shell and a rear shell connected to a rear end of the front shell, the optical part and heat dissipation part being arranged in the front shell, the optical part being located at a front end of the front shell, the circuit board of the electrical part being arranged in the rear shell.

3. The LED illumination device of claim 2, wherein the first air holes and the second air holes are defined in the front shell and separated from each other by a middle annular partition ring of the front shell, the front shell having a plurality of partition ribs extend axially along an axial direction thereof, each of the partition ribs separating two adjacent first air holes from each other and two adjacent second air holes from each other.

4. The LED illumination device of claim 3, wherein the front shell forms at least one protruding bar on an inner surface thereof, the at least one protruding bar each extending along a corresponding partition rib of the front shell, the air guider defining axially at least one elongate groove in an outer circumferential surface thereof corresponding to the at least one protruding bar for receiving the at least one protruding bar therein.

5. The LED illumination device of claim 3, wherein the air guider defines axially an elongate wire collection groove in an outer circumferential surface thereof and defines radially a first collection hole through the outer circumferential surface, the heat dissipation part further comprising a bottom plate located at a rear end of the air guider and connected to the air guider, the bottom plate defining a second collection hole corresponding to the collection groove of the air guider.

6. The LED illumination device of claim 5, wherein the bottom plate defines a wire storage recess and a connecting recess in an outer surface thereof facing the circuit board, the wire storage recess communicating with the second collection hole via the connecting recess.

7. The LED illumination device of claim 2, wherein the heat dissipation part further comprises a bottom plate located between the air guider and the circuit board, the bottom plate isolating the circuit board from the heat dissipation part, a plurality of air passage apertures being provided at a rear end of the rear shell for dissipating heat of the circuit board.

8. The LED illumination device of claim 1, wherein the heat dissipation part further comprises a positioning plate attached to the heat absorbing surface of the solid base of the heat sink, the positioning plate defining a positioning hole therein, the light source being received in the positioning hole of the positioning plate.

9. The LED illumination device of claim 8, wherein the heat dissipation part further comprises a bottom plate located a rear end of the air guider, the bottom plate defining an annular receiving groove in an inner surface thereof facing the air guider, the rear end of the air guider being received in the annular receiving groove of the bottom plate.

10. The LED illumination device of claim 9, wherein the heat dissipation part further comprises a plurality of elongated bolts, the cooling fan having a bracket for mounting the cooling fan to the heat sink, the elongated bolts successively extending through the positioning plate, the heat sink, the bracket of the cooling fan, and then threadedly engaging with the bottom plate, thereby fixing the positioning plate, the heat sink, the cooling fan and the bottom plate together.

11. The LED illumination device of claim 10, wherein a plurality of screw caps are embedded in the inner surface of the bottom plate, the elongated bolts engaging in the screw caps of the bottom plate, respectively.

12. The LED illumination device of claim 2, wherein the optical part further comprises a light reflector and an optical lens which are received in the front end of the front shell, the light reflector having a configuration of a hollow, truncated cone, tapering from the front end towards the rear end of the front shell, the at least one LED of the light source being surrounded by the light reflector, the optical lens being located at a front side of the light reflector, an annular fixing member being provided in front of the optical lens to attach the light reflector and the optical lens securely in the front shell.

13. The LED illumination device of claim 12, wherein a projecting ring is formed on the inner surface of the front end of the front shell, a mounting ring being formed at a front end of the light reflector adjacent to the optical lens and supported on the projecting ring of the front shell.

14. The LED illumination device of claim 1, wherein the solid base has a rear end surface opposite to the heat absorbing surface thereof, and the fins of the heat sink extend axially from the rear end surface of the solid base towards the circuit board of the electrical part.

15. The LED illumination device of claim 1, wherein the fins of the heat sink extend radially and outwardly from a circumferential surface of the solid base.

* * * * *